United States Patent [19]
Perkins

[11] Patent Number: 4,739,248
[45] Date of Patent: Apr. 19, 1988

[54] CURRENT TRANSFORMER CIRCUIT TESTER

[75] Inventor: Mark D. Perkins, Murrysville, Pa.

[73] Assignee: Westinghouse Electric Corp., Pittsburgh, Pa.

[21] Appl. No.: 857,680

[22] Filed: Apr. 30, 1986

[51] Int. Cl.$^4$ .......................................... G01R 31/00
[52] U.S. Cl. ..................................................... 324/55
[58] Field of Search ................... 324/55, 158 NG, 547; 361/35, 36; 364/483

[56] References Cited

U.S. PATENT DOCUMENTS

| | | | |
|---|---|---|---|
| 2,896,156 | 7/1959 | Perrins | 324/55 |
| 3,678,377 | 7/1972 | Chiffert | 324/55 |
| 3,742,346 | 6/1973 | Specht | 324/55 |
| 3,775,675 | 11/1973 | Freeze | 324/55 |

Primary Examiner—A. D. Pellinen
Assistant Examiner—Leon K. Fuller
Attorney, Agent, or Firm—D. R. Lackey

[57] ABSTRACT

Apparatus for determining the size adequacy of a current transformer in an electrical power distribution system. The apparatus includes a voltage generating source for connection in series with a current transformer secondary circuit, which source saturates the current transformer. A first signal is provided which is indicative of the voltage required to cause the current transformer to enter saturation. A second signal is provided which is indicative of the resistance of the secondary circuit of the current transformer after saturation. A third signal is then provided which is responsive to the product of the second signal and predetermined constant value. A ratio of the first to the third signals which exceeds unity indicates adequacy of the current transformer for a given system.

8 Claims, 2 Drawing Sheets

CURRENT TRANSFORMER CIRCUIT TESTER

FIELD OF THE INVENTION

This invention relates generally to electrical power distribution systems, and more specifically, to apparatus for determining the adequacy of size rating of a current transformer (CT) for a specific load in such power distribution systems.

DESCRIPTION OF THE PRIOR ART

Current transformers are utilized in electrical power transmission for such functions as metering, control, and protective relaying. current transformers provide insulation against the high voltage of the power circuit, and provide the current transformer loads with quantities proportional to those of the power circuit but reduced in magnitude so the load devices may be relatively small and inexpensive. An electrical power conductor provides the primary circuit of the current transformer, and it is inductively related to single or multiple secondary windings. Load devices, including meters and protective relays, may be placed in series with a secondary winding to complete the secondary circuit.

Current transformers must be adequately sized to prevent saturation of its magnetic core in the event of an asymmetrical fault in the primary circuit. When a current transformer saturates, its inductance drops and the current substantially increases, thereby posing a danger of harm to the secondary load devices.

To properly size a current transformer, the equation $v \geq 6.28\ IRT$ is used. If the current transformer characteristics satisfy this equation, it is unlikely that fault current in the primary circuit will saturate the current transformer. In the equation, v represents the saturation voltage of the current transformer, I represents the symmetrical secondary current, R represents the total secondary resistance, and T represents the time constant in cycles associated with the decay of the DC component of the asymmetrical fault current through the current transformer. The time constant T is equal to the inductance L of the primary circuit multiplies by the frequency f of the voltage, divided by the resistance $R_p$ of the primary circuit ($Lf/R_p$). While a current transformer may be properly sized upon installation, a subsequent expansion of the system may increase the load, causing the current transformer to become undersized.

Although calculation of the hereinbefore mentioned equation is not difficult to perform, it may be time consuming as it is often difficult to obtain all of the necessary data about the CT and the secondary circuit, e.g., cable resistance, relay impedance, etc.

SUMMARY OF THE INVENTION

The present invention is a portable current transformer circuit tester (CTCT) which determines the adequacy of size rating of a current transformer for a specific load coupled to the secondary winding of the current transformer. The CTCT includes voltage generating means for sequentially generating voltages of both positive and negative polarities. The voltage generating means is connected in the series circuit which includes the load and the secondary winding of the current transformer, to cause the current transformer to enter saturation. The CTCT measures and provides a first signal indicative of the voltage v required to cause the current transformer to enter saturation, a second signal R indicative of the resistance of the secondary circuit after saturation of the current transformer, and a third signal 6.28 ITR indicative of the product of the second signal R and a predetermined constant value 6.28 IT. The CTCT then compares the first and third signals by dividing the first signal by the third signal. A result greater than unity indicates the current transformer will be adequate under the most severe, asymmetrical fault condition.

BRIEF DESCRIPTION OF THE DRAWINGS

The invention may be better understood, and further advantages and uses thereof more readily apparent, when considered in view of the following description of exemplary embodiments, taken with the accompanying drawings in which.

DESCRIPTION OF THE PREFERRED EMBODIMENT

Figure 1:
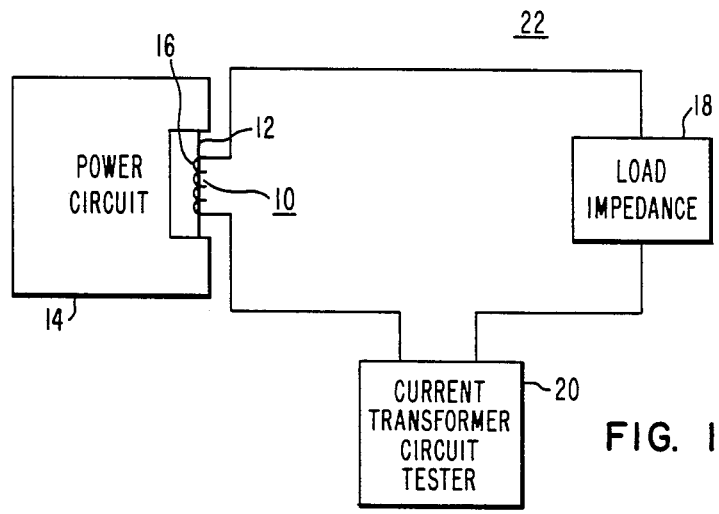
FIG. 1 is a block diagram schematic of the current transformer circuit tester disposed in the secondary circuit of a current transformer.

Referring now to FIG. 1, a current transformer 10 to be tested for size adequacy includes a primary conductor 12 of a power circuit 14, a secondary winding 16, and a load impedance 18. A current transformer circuit tester 20 (CTCT) which may be constructed according to the teachings of the invention is connected in series in the secondary circuit 22 which includes secondary winding 16 and the load impedance 18. Disposed in this configuration, the current transformer circuit tester 20 determines the size adequacy of the current transformer 10 for use with the load impedance 18.

The current transformer circuit tester 20 generates a constant, voltage of a predetermined polarity upon closing of the secondary circuit 22. The current in the secondary circuit 22 increases in response to the applied voltage, and when the secondary winding 16 reaches saturation, the voltage generated by the current transformer circuit tester 20 is reduced to cause the current to remain substantially constant.

Figure 2A:
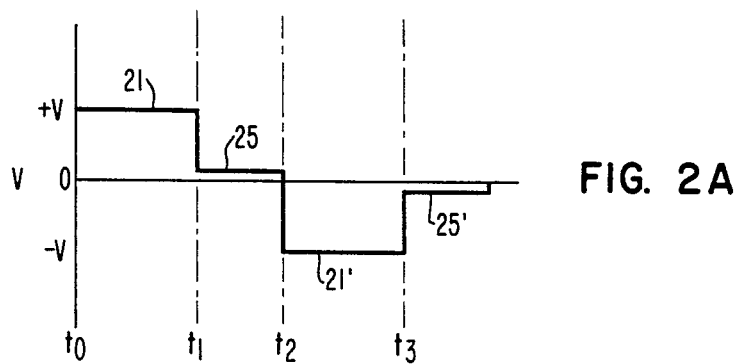
FIGS. 2A and 2B are graphs which illustrates a typical pattern of the voltage generated by the current transformer circuit tester and the resulting current in the secondary circuit.
Figure 2B:
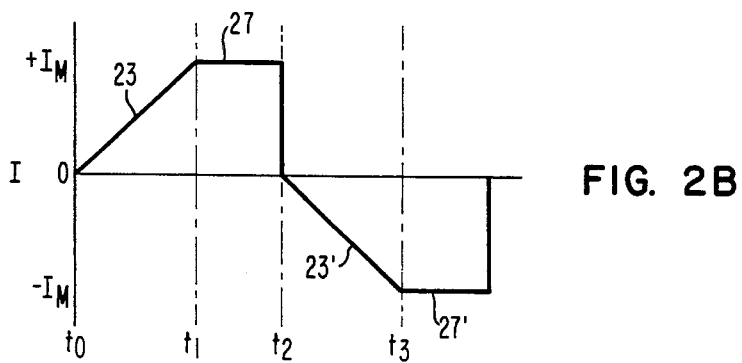

FIGS. 2A and 2B are graphs which more clearly illustrates this relationship between the voltage provided by CTCT 20 and the resulting current in the secondary circuit 22. When the secondary circuit 22 is closed at time $t_0$ shown in FIG. 2A, a positive voltage 21 is generated by the current transformer circuit tester 20. The current 23 shown in FIG. 2B lags the voltage 21, and is initially zero. Because the secondary winding 16 is inductive, the current 23 is the integral of the voltage 21 generated by CTCT 20. This condition is shown between times $t_0$ and $t_1$ of FIG. 2B. When positive saturation is reached at time $t_1$, the current in the secondary circuit 22 would normally increase rapidly in response to the applied voltage. However, the voltage source in CTCT 20 is current limited, and when CT 10 saturates the voltage provided by CTCT 20 is sharply reduced to a value 25 which maintains the current value $I_m$ reached at saturation at a substantially constant value, as indicated at 27.

As shown in FIG. 2A, the voltage provided by CTCT 20 is preferably in the form of square wave having a relatively low frequency, e.g., less than 1 Hz. A low frequency square wave is used to allow CTCT 20 to measure saturation in the positive and negative polarities, with CT 10 being saturated in the opposite polarity at the beginning of each half cycle. This assures that CTCV 20 will have repeatability and consistency independent of any residual flux in the CT at the start of a test. Thus, CTCT 20 is reset at the end of the positive half cycle of the square wave, at time $t_2$ of FIG. 2, and a constant negative voltage 21' is provided by CTCT 20. The current 23' once again lags the voltage 21', and is the integral thereof. This action is shown between times $t_2$ and $t_3$ of FIG. 2B. When negative saturation is reached at time $t_3$, the voltage collapses to a value indicated at 25' and the current is held constant at the value $-I_m$ it reached at negative saturation. This process may be repeated in order to verify the voltage and current values at positive and negative saturation.

Figure 3:
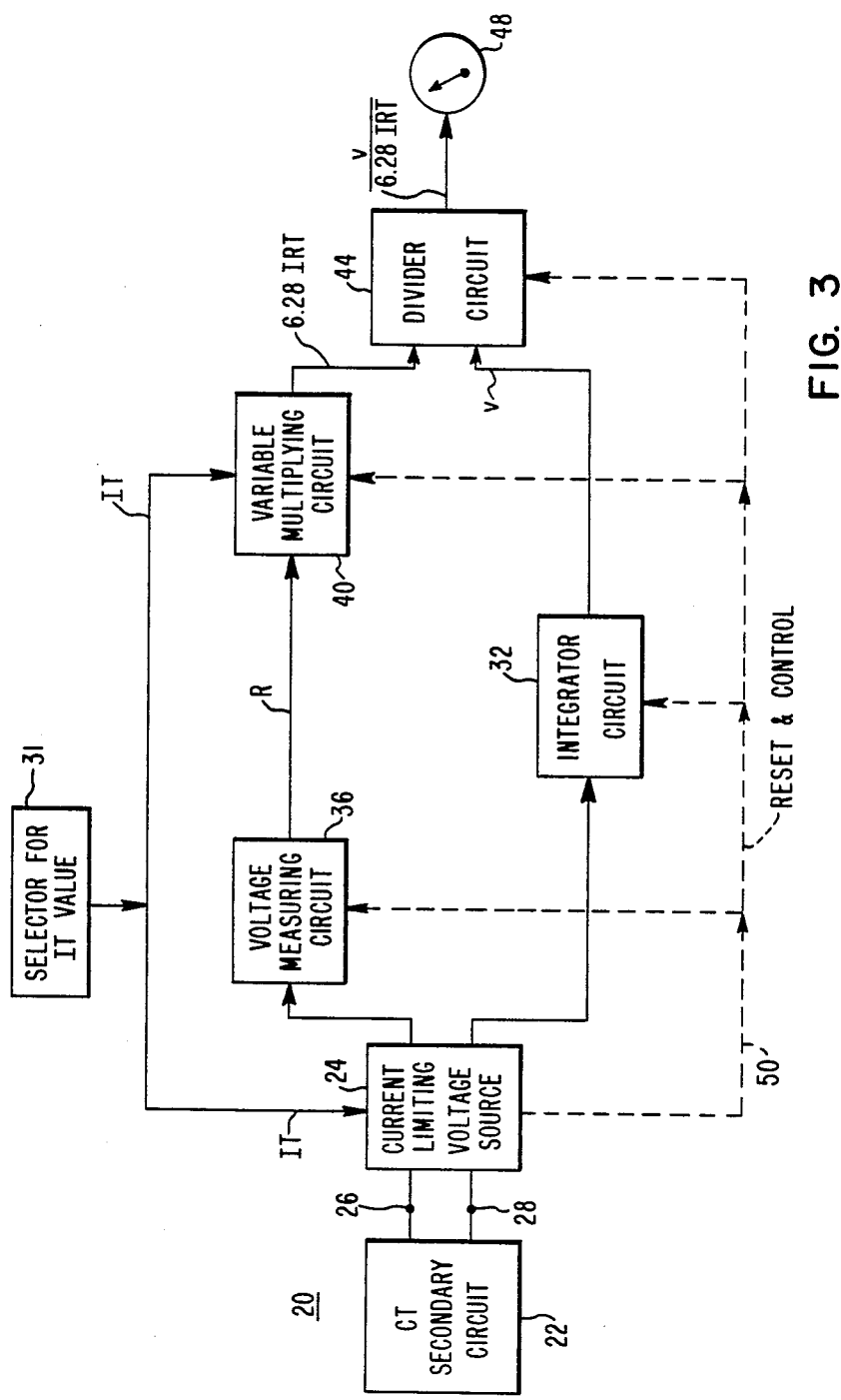
FIG. 3 is a functional block diagram of a current transformer circuit tester which sets forth the teachings of the present inention.

FIG. 3 is a functional block diagram of the current transformer circuit tester 20 constructed according to the teachings of the invention. Broadly, CTCV 20 measures the DC resistance R of the secondary circuit 22 shown in FIG. 1, and the saturation voltage v of CT 10. CTCV 20 includes a current limiting voltage source 24 having terminals 26 and 28 for providing an IT voltage to the secondary circuit 22. An external input signal is selected by the user via a selector 31 and coupled to the current limiting voltage source 24 which controls the current limit setting of the current limiting voltage source 24. The value of signal IT is selected by the user to be responsive to the IT product available from short circuit studies. The IT product is normally constant for all current transformers at the same voltage level in a substation.

The current limiting voltage source 24 is coupled to an input of an integrator circuit 32. The integrator circuit 32 may consist of a conventional operational amplifier integration circuit, for example. Since the voltage collapses immediately after the current transformer staturates, due to the current limiting action of source 24, the output of integrator circuit 32 produces a signal v which is directly proportional to the CT saturation voltage v. The integrator is arranged to hold the value it has accumulated at saturation, without further integration of the voltage.

A voltage measuring circuit 36 measures the voltage drop in the CT secondary circuit after the current limiting function of source 24 occurs. When the circuit reaches steady state conditions, this voltage measuring circuit produces a signal R representative of the DC resistance of the secondary circuit 22. The voltage measuring circuit 36 may be an isolating operational amplifier connected as a sample and hold circuit, for example.

Signal R is coupled to a variable multiplying circuit 40. The multiplication factor of the multiplying circuit 40 is dependent upon the value of the external input signal IT which as hereinbefore stated is responsive to the IT product. This variable multiplying circuit 40 produces a signal 6.28 IRT representative of the product of the multiplication facter IT, the signal R, and a constant 6.28.

The signal 6.28 IRT is coupled to a divider circuit 44. Also coupled to the divider circuit 44 is the signal v produced by the integrator circuit 32. This divider circuit 44 determines the ratio of the signal v provided by integrator circuit 32 to the signal 6.28 IRT provided by the variable multiplying circuit 40. The divider circuit 44 thus provides a signal v/6.28 IRT which is coupled to a display device 48. This display device 48 may consist of an analog meter, for example. The output of circuit 44 may be sealed in per unit of the quantity v/6.28 IRT. Thus, if display 48 registers a value greater than unity, the CT under test should be adequate under the most severe asymmetrical fault condition.

As the current limiting voltage source changes polarity, the circuit components are reset to their initial states by means of an interconnection 50 between the current limiting voltage source 24, the integrator circuit 32, the variable multiplying circuit 40, and the divider circuit 44. This resetting may consist, for example, of grounding the operational amplifiers of the individual circuit components.

In summary, when disposed in the circuit configuration of FIG. 1, the portable current transformer circuit tester 20 quickly determines the size adequacy of the current transformer for the actual load impedance 18 of the secondary circuit, and whether or not additional relaying equipment may be connected in the secondary circuit. CTCV 20 determines the size adequacy of a current transformer by performing the calculation of the equation $v \geq 6.28$ IRT hereinbefore described. In a correctly sized current transformer, the voltage, v, required to place the current transformer in saturation is always equal to or greater than the product of 6.28 IRT. The magnitude of the signal provided by divider 44 therefore indicates that the current transformer is adequately sized if the signal 46 is greater than unity.

While the present invention has been described in connection with the preferred embodiment shown in FIG. 3, it is understood that other similar embodiments may be used or modifications and additions may be made to the described embodiment for performing the same functions of the present invention without deviating therefrom. Therefore, the present invention should not be limited to any single embodiment, but rather construed in breadth and scope in accordance with the recitation of the appended claims.

What is claimed is:

1. Apparatus for determining the adequacy of size rating of a current transformer for use with a load coupled to the secondary winding of the current transformer, comprising:

voltage generating means coupled to a secondary circuit which includes the series connection of a load and the secondary winding of the current transformer under test, said voltage generating means providing a voltage of a predetermined magnitude for causing the current transformer to enter saturation;

means responsive to said voltage generating means for generating a first signal, representative of the saturation voltage;

means responsive to said voltage generating means for generating a second signal representative of the resistance of the secondary circuit after saturation of the current transformer;

means for generating a third signal representative of the product of the second signal and a predetermined constant value; and means for comparing the first and the third signals.

2. The apparatus of claim 1 wherein the voltage generating means includes a current limiting means which limits the current in the secondary circuit after saturation.

3. The apparatus of claim 1 wherein the means for generating the first signal representative of the saturation voltage includes integrating means for determining the integral of the voltage provided by the voltage generating means.

4. The apparatus of claim 1 wherein the means for generating the second signal representative of the resistance of the secondary circuit includes voltage measuring means, with the voltage measuring means measuring the voltage drop in the secondary circuit after saturation, which voltage is proportional to the resistance of secondary circuit.

5. The apparatus of claim 1 wherein the predetermined constant is responsive to the product of the symmetrical secondary current I and the time constant T in cycles associated with the decay of the DC component of the assymetrical fault current through the current transformer under test.

6. The apparatus of claim 1 wherein the voltage generating means provides a low frequency square wave.

7. Apparatus for determining the adequacy of size rating of a current transformer having a secondary winding connected in a secondary circuit which includes a load, comprising:
   current limited voltage generating means adapted for series connection in the secondary circuit,
   said current limited voltage generating means providing a first voltage of predetermined polarity which has a constant value until the current transformer saturates, and then a reduced value having a magnitude which maintains the value of the current at saturation,
   means providing a signal v responsive to the saturation voltage of the current transformer under test, with said means integrating the voltage provided by said current limited voltage generating means,
   means providing a signal R responsive to the DC resistance of the secondary circuit after saturation of the current transformer under test, with said means measuring the voltage drop in the secondary circuit,
   means multiplying the signal R by a constant 6.28 IT associated with the current transformer under test, to provide a signal 6.28 IRT,
   and means comparing signal v with signal 6.28 IRT by dividing v by 6.28 IRT to provide a ratio which indicates size adequacy when it exceeds unity.

8. The apparatus of claim 7 wherein the current limited voltage generating means provides a second voltage having a polarity opposite to the polarity of the first voltage, after saturation of the current transformer in response to the first voltage, to initiate another test which starts with the current transformer saturated in the opposite polarity, to provide repeatability and consistency independent of any residual flux in the current transformer at the start of a test.

* * * * *